(12) United States Patent
Parvizi et al.

(10) Patent No.: US 11,196,534 B1
(45) Date of Patent: Dec. 7, 2021

(54) APPARATUS AND METHODS FOR LOW POWER CLOCK GENERATION IN MULTI-CHANNEL HIGH SPEED DEVICES

(71) Applicant: Ciena Corporation, Hanover, MD (US)

(72) Inventors: Mahdi Parvizi, Kanata (CA); Yuriy Greshishchev, Ottawa (CA); Naim Ben-Hamida, Nepean (CA); Douglas Stuart McPherson, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/109,765

(22) Filed: Dec. 2, 2020

(51) Int. Cl.
*H04L 7/00* (2006.01)
(52) U.S. Cl.
CPC .................... *H04L 7/0008* (2013.01)
(58) Field of Classification Search
CPC ............... H04L 7/0008; H04L 7/00
See application file for complete search history.

(56) References Cited

U.S. PATENT DOCUMENTS

| | | | | |
|---|---|---|---|---|
| 6,671,343 B1* | 12/2003 | Ito | ............... | H04J 3/0664 375/376 |
| 7,015,842 B1* | 3/2006 | Gupta | ............... | G11C 27/024 341/122 |
| 10,320,374 B2 | 6/2019 | Parvizi et al. | | |
| 10,341,082 B1* | 7/2019 | Balakrishnan | ....... | H04B 1/0007 |
| 10,374,623 B1* | 8/2019 | Oveis Gharan | ....... | H03M 1/662 |
| 2002/0019898 A1* | 2/2002 | Hayashi | ............. | G06F 13/4217 710/110 |
| 2004/0108954 A1* | 6/2004 | Richley | ............. | G01S 5/0226 342/387 |
| 2014/0015700 A1* | 1/2014 | Oishi | ............. | H03M 3/30 341/143 |
| 2014/0362892 A1* | 12/2014 | Richley | ............. | A42B 3/30 375/148 |

OTHER PUBLICATIONS

M. Parvizi, K. Allidina and M. N. El-Gamal, "An ultra-low power, low voltage CMOS squarer circuit for non-coherent IR-UWB receivers," in IEEE International Symposium on Circuits and Systems (ISCAS), Seoul, 2012, pp. 2533-2536.

(Continued)

*Primary Examiner* — Jaison Joseph
(74) *Attorney, Agent, or Firm* — Young Basile Hanlon & MacFarlane, P.C.

(57) ABSTRACT

Described are apparatus and methods for low power clock generation in multi-channel high speed devices. In implementations, a multi-channel data processing device includes a low frequency clock generation and distribution circuit configured to generate and distribute a 1/N sampling frequency $(F_S)(F_S/N)$ clock, wherein N is larger or equal to 8, and multiple data processing channels connected to the low frequency generation and distribution circuit. Each data processing channel including input ports associated with different operating frequency clocks, and a channel local clock generation circuit comprising multipliers associated with some of the input ports, each multiplier configured to multiply the $F_S/N$ frequency clock to locally generate an operating frequency clock associated with an input port of the input ports.

20 Claims, 10 Drawing Sheets

(56) References Cited

OTHER PUBLICATIONS

Y. Greshishchev et al., "A 56GS/s 6b DAC in 65nm CMOS with 256×6b Memory", in Internal Solid-State Circuit Conference, San Francisco, CA, 2011, pp. 194-196.
Y. Greshishchev et al., "A 60 GS/s 8-b DAC with > 29.5dB SINAD up to Nyquist frequency in 7nm FinFET CMOS," 2019 IEEE BiCMOS and Compound semiconductor Integrated Circuits and Technology Symposium (BCICTS), Nashville, TN, USA, 2019, pp. 1-4.

* cited by examiner

APPARATUS AND METHODS FOR LOW POWER CLOCK GENERATION IN MULTI-CHANNEL HIGH SPEED DEVICES

TECHNICAL FIELD

This disclosure relates to clock generation circuits. More specifically, this disclosure relates to low power clock generation.

BACKGROUND

The requirements for low power clock generation at higher rates in wireline transceivers increase directly with the ever-increasing baud rates associated with evolving generations of digital communications systems and the need for low power transceivers for data center interconnects. One example is optical coherent modems, which are foundational to achieving transport speeds of 100G and beyond, delivering Terabits of information. In addition to increased baud rate for a single channel, optical coherent modems are composed of multiple (typically four) channels. All channels must operate in synchronicity with each other and have equal bit delays. The nature of multiple channel modems makes it especially important that the transmitter (Tx) startup clock phases be aligned across all channels while the total power used to generate the clocks be as low as possible.

SUMMARY

Described herein are apparatus and methods for low power clock generation in multi-channel high speed devices.

In implementations, a multi-channel data processing device includes a low frequency clock generation and distribution circuit configured to generate and distribute a 1/N sampling frequency $(F_S)(F_S/N)$ clock, where N is larger or equal to 8, and multiple data processing channels connected to the low frequency generation and distribution circuit. Each data processing channel including input ports associated with different operating frequency clocks, and a channel local clock generation circuit comprising multipliers associated with some of the input ports, each multiplier configured to multiply the $F_S/N$ frequency clock to locally generate an operating frequency clock associated with an input port of the input ports.

In implementations, the channel local clock generation circuit further including a multi-phase clock generator configured to generate multiple $F_S/N$ frequency clocks with different phases for each input port. In implementations, the different phases are $1/F_S$ apart. In implementations, a number of the multiple $F_S/N$ frequency clocks is dependent on a timing margin needed by a data processing channel to process input data. In implementations, each data processing channel further including a multiplexor associated with each input port, and a multi-phase clock generator connected to each multiplexor, the multi-phase clock generator configured to generate a number of $F_S/N$ frequency clocks with different phases, wherein the number is dependent on a timing margin requirement of a multiplexor to process input data. In implementations, the low frequency clock generation and distribution circuit further including an $F_S/N$ divider to generate an operating frequency clock associated with another input port of the input ports. In implementations, the channel local clock generation circuit further comprising an $F_S/N$ divider to generate an operating frequency clock associated with another input port of the input ports. In implementations, the low frequency clock generation and distribution circuit further comprising a phase locked loop operating at a $F_S/N$ frequency clock, the phase locked loop configured to generate the $F_S/N$ frequency clock from a reference clock. In implementations, the multi-channel data processing device is a multi-channel digital-to-analog converter (DAC) and each data processing channel is a M bit DAC channel with M data paths, each data path including a set of the input ports and a multiplexor associated with each input port in the set of input ports, the channel local clock generation circuit configured to provide the different operating frequency clocks to each of the M data paths. In implementations, the channel local clock generation circuit further comprising a multi-phase clock generator configured to generate a number of $F_S/N$ frequency clocks with different phases, wherein the number is dependent on a timing margin requirement of a multiplexor to process input data.

In general, a method for low power clock generation, includes generating, by a phase locked loop of a multi-channel high-speed data processing device, a 1/N sampling frequency $(F_S)(F_S/N)$ frequency clock from a reference clock, where N is larger or equal to 8, locally generating, in each high-speed data processing channel of the multi-channel high-speed data processing device, multiple operating frequency clocks for multiple multiplexors by multiplying the $F_S/N$ frequency clock by multiple multipliers, the multiple multiplexors and the multiple multipliers in the high-speed data processing channel, controlling a multiplexor of the multiple multiplexors with an associated operating frequency clock of the multiple operating frequency clocks, and outputting data based on processing input data using the multiple operating frequency clocks and the multiple multiplexors.

In implementations, the method further includes generating, by a multi-phase clock generator in the high-speed data processing channel, multiple $F_S/N$ frequency clocks with different phases for controlling each of the multiple multiplexors. In implementations, the different phases are $1/F_S$ apart. In implementations, a number of the multiple $F_S/N$ frequency clocks is dependent on a timing margin needed by the multiple multiplexors to process the input data. In implementations, the method further includes dividing, by $F_S/N$ divider in the multi-channel high-speed data processing device, the $F_S/N$ frequency clock to generate an operating frequency clock associated with another multiplexor of the multiple multiplexors. In implementations, the method further includes locally dividing, by $F_S/N$ divider in the high-speed data processing channel, the $F_S/N$ frequency clock to generate an operating frequency clock associated with another multiplexor of the multiple multiplexors.

In implementations, a method for low power clock generation includes distributing, by a low frequency clock generation and distribution circuit of a multi-channel data processing device, a 1/N sampling frequency $(F_S)(F_S/N)$ frequency clock based on a reference clock, where N is larger or equal to 8, locally multiplying, at multiple input ports of each data processing channel of the multi-channel data processing device, the $F_S/N$ frequency clock by a multiplier to generate an operating frequency clock associated with each input port of the multiple input ports, and generating output data by processing input data using multiple operating frequency clocks.

In implementations, the method further includes generating, by a multi-phase clock generator in the data processing channel, a number of $F_S/N$ frequency clocks with different phases. In implementations, the different phases are $1/F_S$ apart and the number of the $F_S/N$ frequency clocks is dependent on a timing margin needed by a data processing channel to process the input data. In implementations, the method further includes dividing, by $F_S/N$ divider, the $F_S/N$ frequency clock to generate an operating frequency clock associated with another input port of the multiple input ports.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figures 1A, 1B:
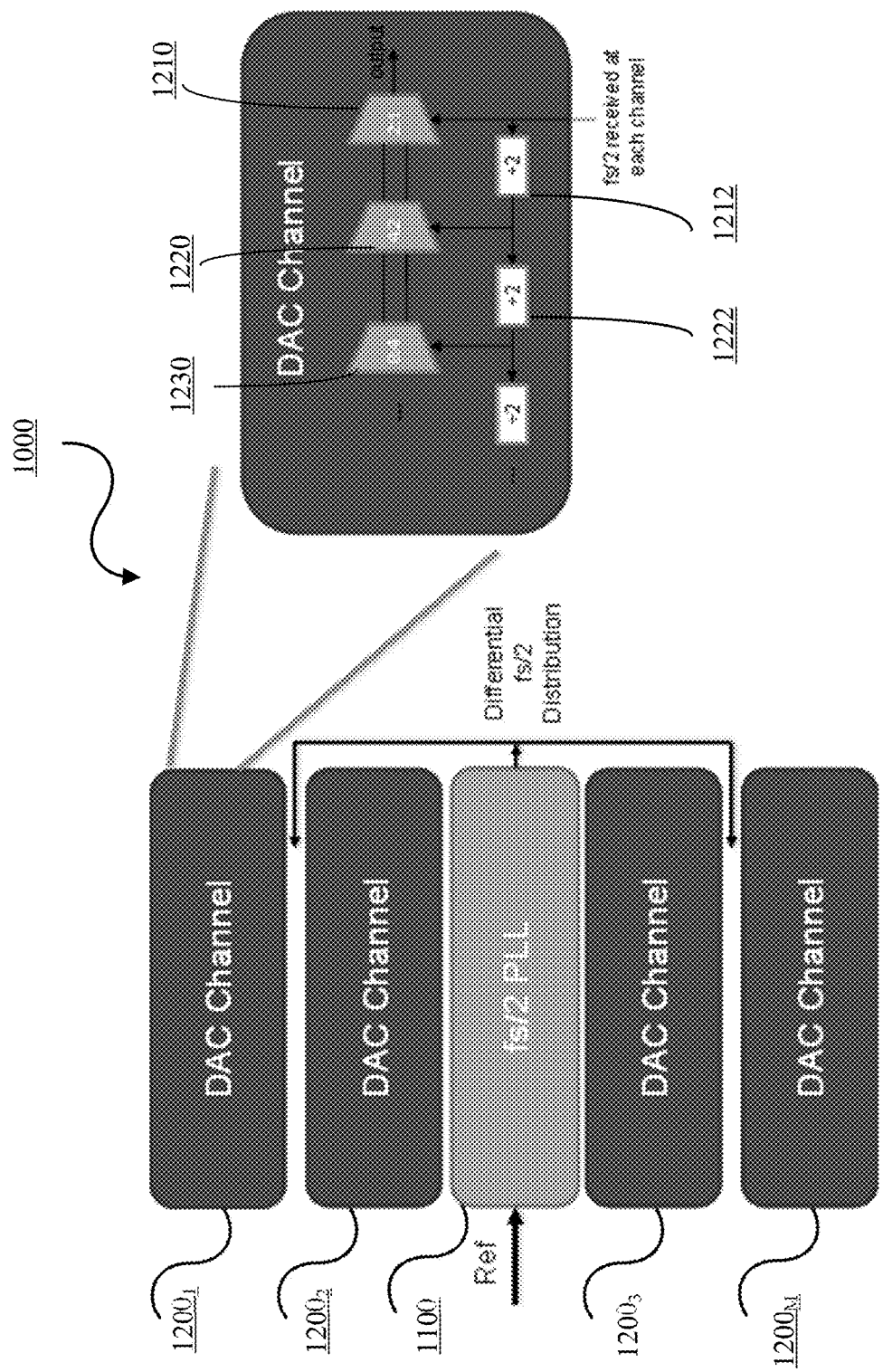
FIG. 1A is a block diagram of an example of a $F_S/2$ clock generation and distribution architecture for a multi-channel device.
FIG. 1B is a block diagram of an example of a digital-to-analog converter (DAC) channel.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Most high-speed, high-performance transmitter (Tx) serializers and digital-to-analog converters (DACs) require clocks at the Nyquist frequency or one half the sampling frequency ($F_S/2$), one half the Nyquist frequency ($F_S/4$), one quarter the Nyquist frequency ($F_S/8$), and other binary divide ratios for data interleaving or multiplexing stages, for example. Prior techniques generate the highest speed clock ($F_S/2$) in the clock generation block and to distribute it to the individual DAC or Serializer/Deserializer (SERDES) channels. The $F_S/2$ clock is used in the last multiplexing (MUX) stage and is then subsequently divided to create the synchronous $F_S/4$, $F_S/8$, $F_S/16$, and lower rate clocks.

FIG. 1A is a block diagram of an example of a $F_S/2$ clock generation and distribution architecture for a multi-channel high speed device 1000 and FIG. 1B is a block diagram of an example of a digital-to-analog converter (DAC) channel 1200₁. The multi-channel high speed device 1000 includes a phase locked loop (PLL) 1100 which is connected to or in communication with (collectively "connected to") multiple DAC channels 1200₁, 1200₂, . . . , 1200_M. The PLL 1100 performs as a clock multiplier for a high precision external reference clock (Ref) and generates the $F_S/2$ clock. The $F_S/2$ clock can be a differential $F_S/2$ clock. The $F_S/2$ clock is distributed to each of the multiple DAC channels 1200₁, 1200₂, . . . , 1200_M. A DAC channel, such as for example DAC channels 1200₁, includes multiple MUX stages 1210, 1220, 1230, and so on, which are driven by an appropriate division of the distributed $F_S/2$ clock. For example, the MUX stage 1210 is a 2:1 MUX and is directly connected to $F_S/2$ clock. For example, the MUX stage 1220 is a 4:2 MUX and is connected to the $F_S/2$ clock via a divide by 2 divider 1212 to provide a $F_S/4$ clock. For example, the MUX stage 1230 is an 8:4 MUX and is connected to the $F_S/2$ clock via the divide by 2 divider 1212 and a divide by 2 divider 1222 to provide a $F_S/8$ clock and so on.

Figure 2:
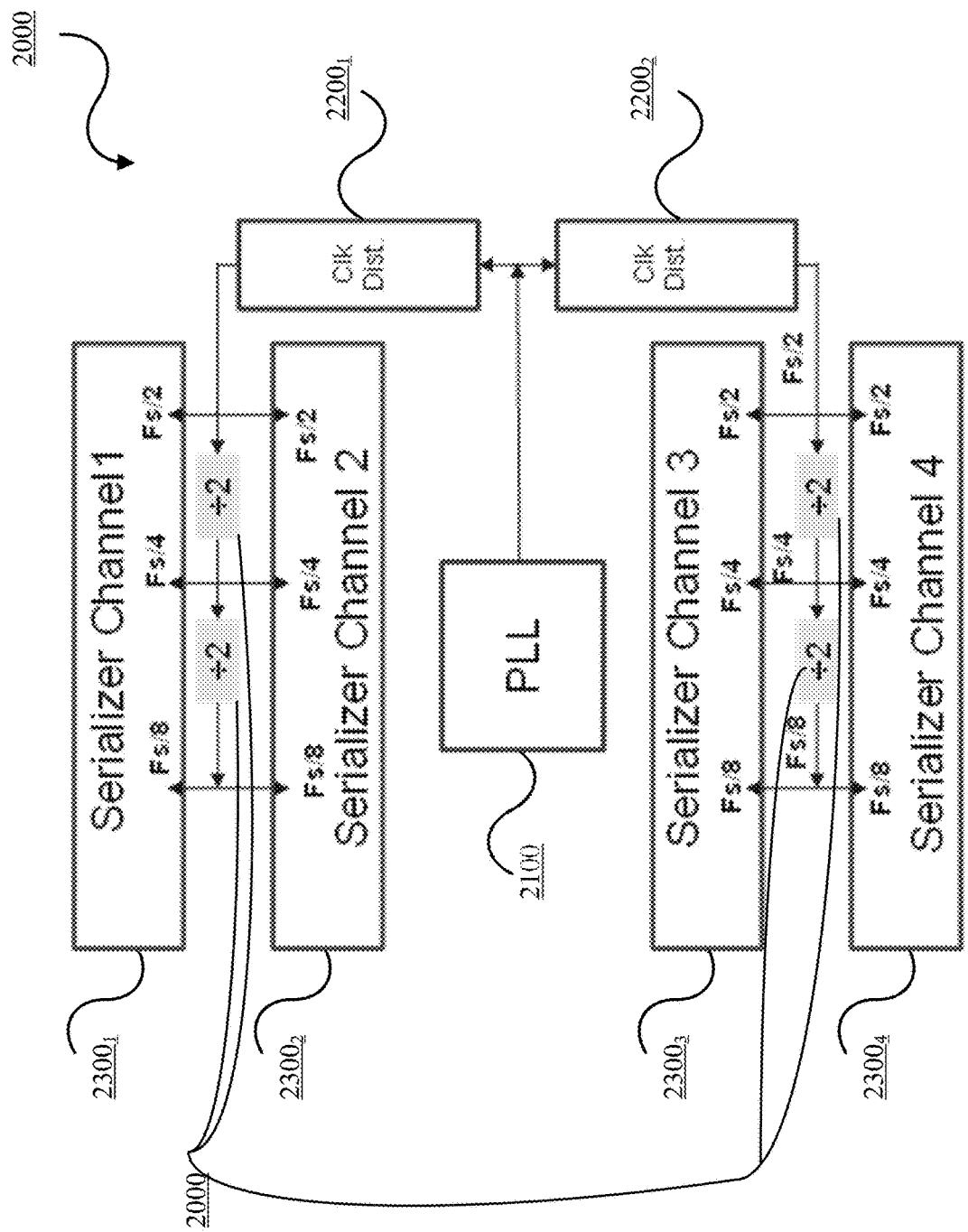
FIG. 2 is a block diagram of an example of a clock generation architecture for a multi-channel transmitter serializer.

FIG. 2 is a block diagram of an example of a clock generation architecture for a multi-channel transmitter serializer 2000. The multi-channel transmitter serializer 2000 includes a PLL 2100 connected to four serializer channels 2300₁, 2300₂, 2300₃, and 2300₄ via clock distribution circuits 2200₁ and 2200₂, respectively. The PLL 2100 generates a $F_S/2$ clock which is distributed via the distribution circuits 2200₁ and 2200₂ and divided appropriately by dividers 2400.

Figure 3:
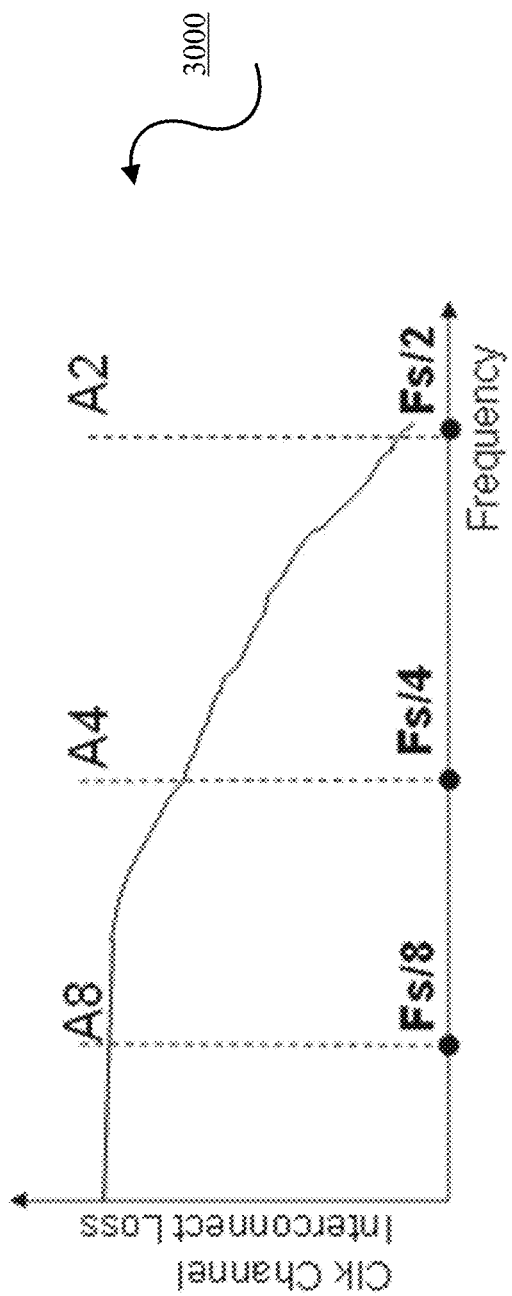
FIG. 3 is an example of clock distribution channel loss and associated power consumption for different clock frequencies.

As noted, the PLL 1100 and PLL 2100 generate a $F_S/2$ clock. This can be the done either with a PLL whose voltage-controlled oscillator (VCO) operates at a fundamental frequency of $F_S/2$ or at $F_S/4$ and multiplied up to $F_S/2$. Regardless of the generation technique, $F_S/2$ is distributed to each DAC or serializer channel, respectively. As shown in FIG. 3, clock distribution losses go up rapidly with frequency due to skin effect. To compensate for the losses, more gain stages are required. However, the gain stages are less efficient, and overall power consumption becomes prohibitive. This is especially true when the sample rates exceed 100 GHz. In this architecture, the clocking circuitry consumes the majority of the total power of the DAC or SERDES itself, while the circuitry for serializing the data is a much smaller portion. Distributing and dividing the $F_S/2$ clock in each channel also contributes to the high-power consumption.

Another issue with this architecture concerns channel to channel synchronization. The $F_S/2$ clock is distributed and divided down in each separate channel. In this case, the start-up bit misalignment due to divide by two (2) phase uncertainty varies between a minimum of ±2 unit intervals (UI=1/$F_S$) to a maximum misalignment of ±(8 UI+4 UI+2 UI) between each channel. This fact results in two major issues. First, the clock dividers in each channel must include additional circuitry to adjust the phase of the clocks in each channel to bring them back in to alignment with each other and this consumes more power. Secondly, a comprehensive startup calibration or training sequence is required to discover and correct for the misalignment and this requires microprocessor, which also consumes power and increases the complexity of the DAC or SERDES.

Problematically, power consumption for clock generation blocks in the DAC channels are high and cannot meet stringent system requirements. Moreover, at chip initialization, the output state of the $F_S/2$ clock divider is unknown. This is an issue for channel-to-channel synchronization. Jitter levels are higher as the PLL needs to increase its divide ratio to generate the $F_S/2$ clock. Moreover, the design of a divider running at $F_S/2$ is also difficult. In addition, the design of the $F_S/2$ clock distribution is challenging and consumes lots of power, including, but not limited to, a need for symmetrical chip layouts. This is increasingly so as the data rates goes higher.

Described herein are apparatus, devices, circuits, systems, and methods for low power clocking architecture in multi-channel high speed devices, multi-channel high speed transmitter devices, multi-channel high speed transmitter serializer devices, and the like. The methods provide low power synchronous multi-rate clocks for, but are not limited to, serializer-deserializers (SERDES), digital to analog converters (DAC), and the like. The low power clocking architecture addresses the above-mentioned issues by simplifying clock generation and distribution. In implementations, a clock rate at an input of each channel in a high-speed multi-channel device is reduced to a $F_S/8$ frequency or lower frequency. This reduces a VCO operating frequency in the PLL and reduces the divide ratio as well.

In implementations, the low power clocking architecture uses multipliers to multiply up the $F_S/8$ or lower clock to higher clocks such as $F_S/2$, $F_S/4$, and the like. Consequently, unlike divider based architectures, the state of the high frequency clocks (fs/2, fs/4, and so on) can be deterministically anticipated, allowing for channel to channel synchronization or enabling channel to channel alignment. Consequently, the architecture is more robust to power supply transients and brown-outs in the field in that the alignment of the clocks would naturally return to the correct values versus the need to go through an elaborate realignment process which would result in a longer interval to recover the traffic. In implementations, in the event a divider is needed to generate a clock, the $F_S/8$ or lower clock is at such a low frequency that the $F_S/8$ or lower clock can be properly synchronized between channels using a reset signal. In implementations, any such divider is operating at the lower frequencies as opposed to $F_S/2$.

In implementations, the low power clocking architecture enables low power operation with localized clock generation, low frequency multi-phase clock generation, reduces the complexity and power consumption of clock distribution between PLL and each data processing channel in a multi-channel data processing device, reduces any clock feed-through to DAC outputs, and reduces the divide ratio in PLLs which helps improve jitter performance in the PLLs.

In implementations, the stringent power requirements of pluggable digital signal processors is addressed via localized clock generation operating at low power. In implementations, inter-channel delay calibration is not needed due to the use of the multipliers.

Figure 4:
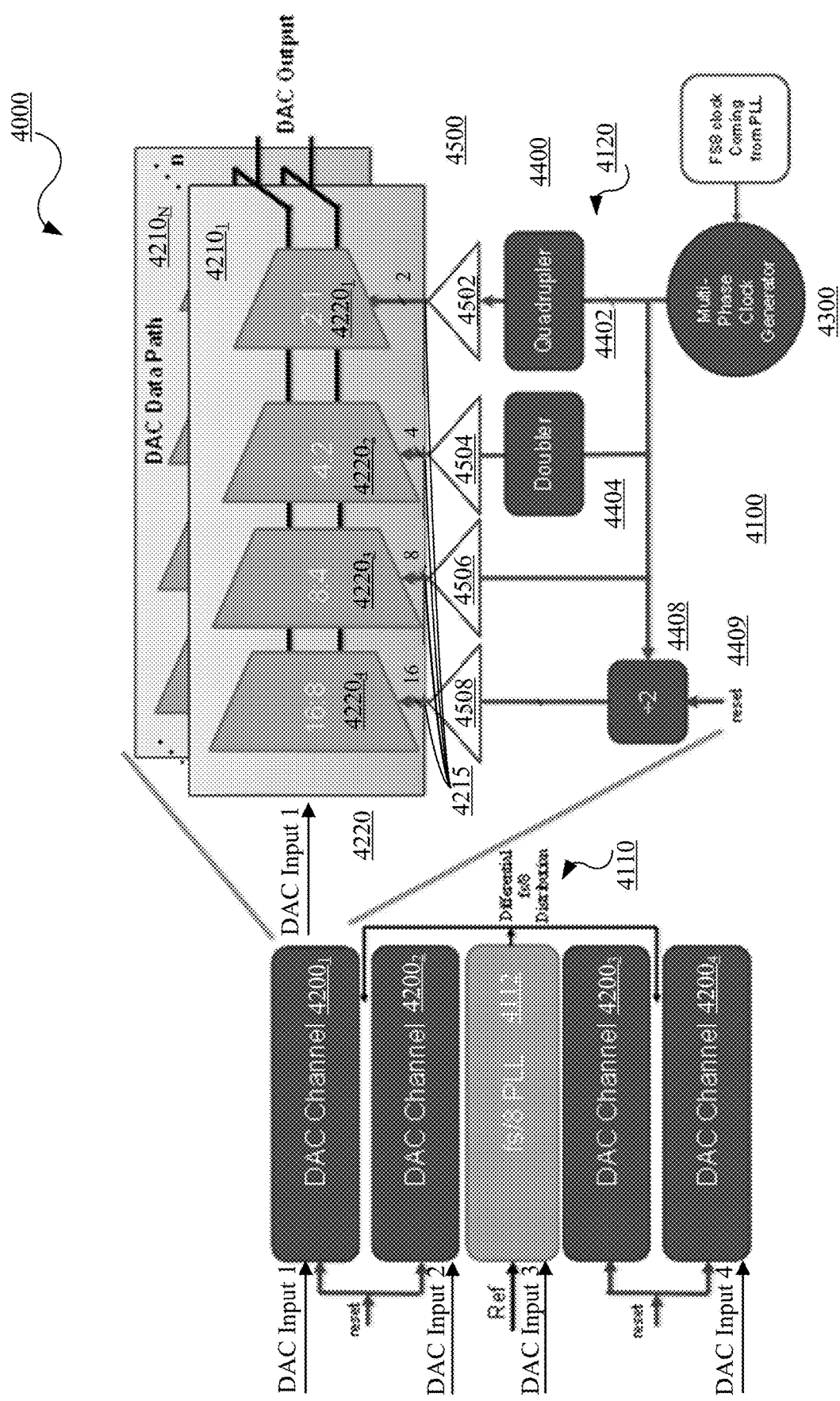
FIG. 4 is a block diagram of an example of a multi-channel DAC high speed device which includes a low power clock generation circuit in accordance with embodiments of this disclosure.

FIG. 4 is a block diagram of an example of a multi-channel DAC high speed device 4000 which includes a low power clock generation circuit 4100 in accordance with embodiments of this disclosure. The low power clock generation circuit 4100 includes a low frequency generation and distribution circuit 4110 and a channel local generation circuit 4120. The low frequency generation and distribution circuit 4110 includes a PLL 4112 which operates at and generates a low frequency clock from a reference clock (Ref). In implementations, the low frequency clock is a $F_S/8$ frequency clock. In implementations, the low frequency clock can be at least a $F_S/8$ or lower frequency clock. In implementations, the low frequency clock can be at least a differential $F_S/8$ or lower frequency clock. In implementations, the reference clock is a high precision external reference clock. In implementations, the reference clock can be a high frequency signal.

The multi-channel DAC high speed device 4000 includes multiple DAC channels 4200₁, 4200₂, 4200₃, and 4200₄. In implementations, the number of multiple DAC channels is M. The low frequency generation and distribution circuit 4110 generates and distributes the low frequency clock for use in the multiple DAC channels 4200₁, 4200₂, 4200₃, and 4200₄ via the channel local generation circuit 4120.

Each of the multiple DAC channels 4200₁, 4200₂, 4200₃, and 4200₄, such as DAC channels 4200₁, for example, is a N bit DAC with N data paths 4210₁, ..., 4210$_N$. Each of the data paths 4210₁, ..., 4210$_N$, such as data path 4210₁, includes input ports 4215 associated with different operating frequency clocks. Each of the data paths 4210₁, ..., 4210$_N$, such as data path 4210₁, includes multiplexors 4220 such as, but not limited to, a 2:1 multiplexor 4222 operating at a $F_S/2$ clock frequency or rate, a 4:2 multiplexor 4224 operating at a $F_S/4$ clock frequency or rate, a 8:4 multiplexor 4226 operating at a $F_S/8$ clock frequency or rate, and a 16:8 multiplexor 4228 operating at a $F_S/16$ clock frequency or rate. The number of input ports 4215 along with the number and type of multiplexors comprising multiplexors 4220 associated with the input ports 4215 are illustrative and can vary without departing from the scope of the specification and claims described herein.

Each of the multiple DAC channels 4200₁, 4200₂, 4200₃, and 4200₄, such as DAC channels 4200₁, for example, further includes a multi-phase clock generator 4300, factoring circuits 4400, and buffers 4500. The channel local generation circuit 4120 comprises the multi-phase clock generator 4300, the factoring circuits 4400, and the buffers 4500. The multi-phase clock generator 4300 operates at the low frequency clock. The multi-phase clock generator 4300 can generate multiple clocks with different phases separated by 1 UI (1/$F_S$) with respect to each other. The number of phases depends on the timing margin needed by the multiplexors 4220 to process the data input to the multiple DAC channels 4200₁, 4200₂, 4200₃, and 4200₄. In implementations, the multi-phase clock generator 4300 can be a delay locked loop, an injection locked oscillator, or like circuits and/or devices.

The multi-phase clock generator 4300 is connected to the 2:1 multiplexor 4222 via a quadrupler 4402 and a buffer 4502. The multi-phase clock generator 4300 is connected to the 4:2 multiplexor 4224 via a doubler 4404 and a buffer 4504. The multi-phase clock generator 4300 is connected to the 8:4 multiplexor 4226 via a buffer 4506. The multi-phase clock generator 4300 is connected to the 16:8 multiplexor 4228 via a divider 4408 and a buffer 4508. As described herein, at least some of the input ports 4215 have multipliers such as the quadrupler 4402 and the doubler 4404. In implementations, in the instance when a divider such as the divider 4408 is needed to generate the frequency clock for the multiplexor, each DAC channel is connected to a reset signal 4409, provided by a controller, to synchronize a state or state machine of the dividers on the multiple DAC channels. The divider 4408 is a low frequency divider, such as a $F_S/8$ divider, so that it can be synchronized between the multiple DAC channels using the reset signal shown in FIG. 4

In the illustrative implementation of FIG. 4, the multi-phase clock generator 4300 provides 8 clocks with 1 UI phase separation, which is then processed through the appropriate factoring circuits 4400 and buffers 4500, as applicable, to generate 2 phases at the $F_S/2$ frequency clock for the 2:1 multiplexor 4222, to generate 4 phases at the $F_S/4$ frequency clock for the 4:2 multiplexor 4224, to generate 8 phases at the $F_S/8$ frequency clock for the 8:4 multiplexor 4226, and to generate 16 phases at the $F_S/16$ frequency clock for the 16:8 multiplexor 4228, which in turn are used to process the appropriate DAC input to generate the DAC output.

Consequently, the channel local generation circuit 4120 is local or in each of the multiple DAC channels 4200₁, 4200₂, 4200₃, and 4200₄ and locally generates the appropriate higher frequency clocks. That is, the channel local generation circuit 4120 receives the low frequency clock from the low frequency generation and distribution circuit 4110 and multiplies the clocks up (instead of dividing down) as and when appropriate. Therefore, the state of the higher frequency clocks ($F_S/2$ and $F_S/4$) can be deterministically anticipated and allows for channel to channel synchronization without a reset signal.

Figure 5:
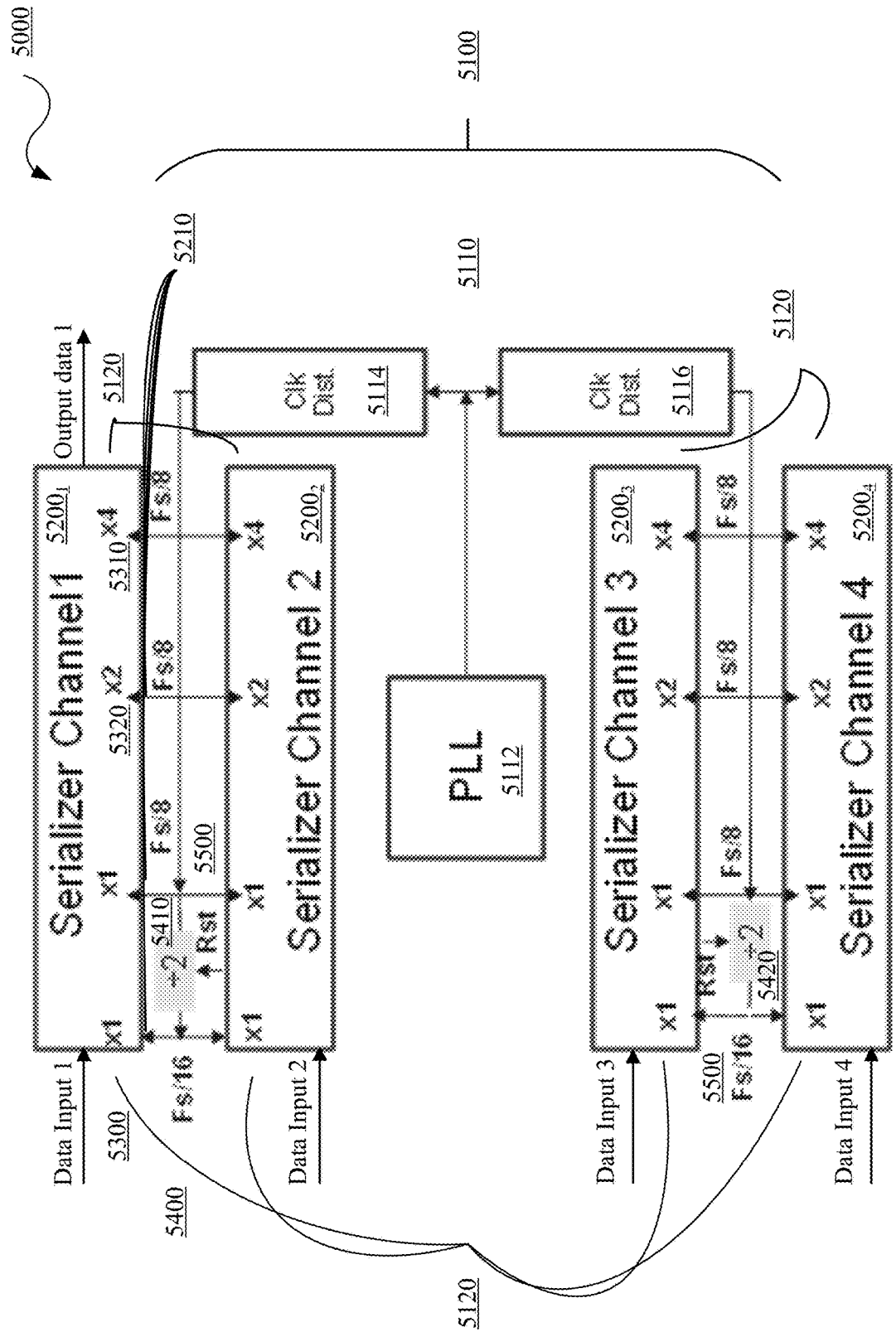
FIG. 5 is a block diagram of an example of a multi-channel transmitter serializer which includes a low power clock generation circuit in accordance with embodiments of this disclosure.

FIG. 5 is a block diagram of an example of a multi-channel transmitter serializer 5000 which includes a low power clock generation circuit 5100 in accordance with embodiments of this disclosure. The low power clock generation circuit 5100 includes a low frequency generation and distribution circuit 5110 and a channel local generation circuit 5120. The low frequency generation and distribution circuit 5110 includes a PLL 5112 which operates at and generates a low frequency clock from a reference clock and distribute via clock distribution circuits 5114 and 5116. In implementations, the low frequency clock is a $F_S/8$ frequency clock. In implementations, the low frequency clock can be at least a $F_S/8$ or lower frequency clock. In implementations, the low frequency clock can be at least a differential $F_S/8$ or lower frequency clock. In implementations, the reference clock is a high precision external reference clock. In implementations, the reference clock can be a high frequency signal.

The multi-channel transmitter serializer 5000 includes multiple serializer channels $5200_1$, $5200_2$, $5200_3$, and $5200_4$. In implementations, the number of multiple serializer channels is M. The low frequency generation and distribution circuit 5110 generates and distributes the low frequency clock for use in the multiple serializer channels $5200_1$, $5200_2$, $5200_3$, and $5200_4$ via the channel local generation circuit 5120.

Each of the multiple serializer channels $5200_1$, $5200_2$, $5200_3$, and $5200_4$, for example, serializer channel $5200_1$ includes input ports 5210 associated with different operating frequency clocks. Each of the multiple serializer channels $5200_1$, $5200_2$, $5200_3$, and $5200_4$, for example, serializer channel $5200_1$ includes multipliers 5300 such as multiplier 5310 and multiplier 5320 to locally generate the frequency clocks used by the multiple serializer channels $5200_1$, $5200_2$, $5200_3$, and $5200_4$ to process the data inputs to generate the output data (output data 1 is shown as an example). The channel local generation circuit 5120 comprises the multipliers 5300. For example, the multiplier 5310 is a quadrupler which generates a $F_S/2$ clock frequency from the distributed $F_S/8$ frequency clock and the multiplier 5320 is a doubler which generates a $F_S/4$ clock frequency from the distributed $F_S/8$ frequency clock. In FIG. 5, the symbol "x1" represents a direct connection to the frequency clock being input to the multiple serializer channel. In this instance implementation, there are two x1s, namely, x1 5330 and x1 5340. As described herein, at least some of the input ports 5210 have multipliers such as the double-quadrupler 8402, the multiplier 5310 and the multiplier 5320. In implementations, multi-channel transmitter serializer 5000 can include dividers 5400, such as dividers 5410 and 5420, which divide down the distributed $F_S/8$ frequency clock to generate a $F_S/16$ frequency clock. The output of the dividers 5410 and 5420 are directly connected to the serializers as shown by the x1 5330 and x1 5340 input designations. In the instance when a divider such as the dividers 5410 and 5420 are needed to generate the frequency clock for the serializer, each of the dividers 5410 and 5420 are connected to a reset signal 5500, provided by a controller, to synchronize a state or state machine of the dividers. The dividers 5410 and 5420 are low frequency dividers, such as a $F_S/8$ divider, so that the dividers 5410 and 5420 can be synchronized as between themselves. The dividers 5400, when appropriate, can be deemed as part of the low frequency generation and distribution circuit 5110.

Consequently, the channel local generation circuit 5120 is local or in each of the multiple serializer channels $5200_1$, $5200_2$, $5200_3$, and $5200_4$ and locally generates the appropriate high frequency clocks. That is, the channel local generation circuit 5120 receives the low frequency clock from the low frequency generation and distribution circuit 5110 and multiplies the clocks up (instead of dividing down) as and when appropriate. Therefore, the state of the frequency clocks ($F_S/2$, $F_S/4$, and $F_S/8$) can be deterministically anticipated and allows for channel to channel synchronization without a reset signal.

Figure 6:
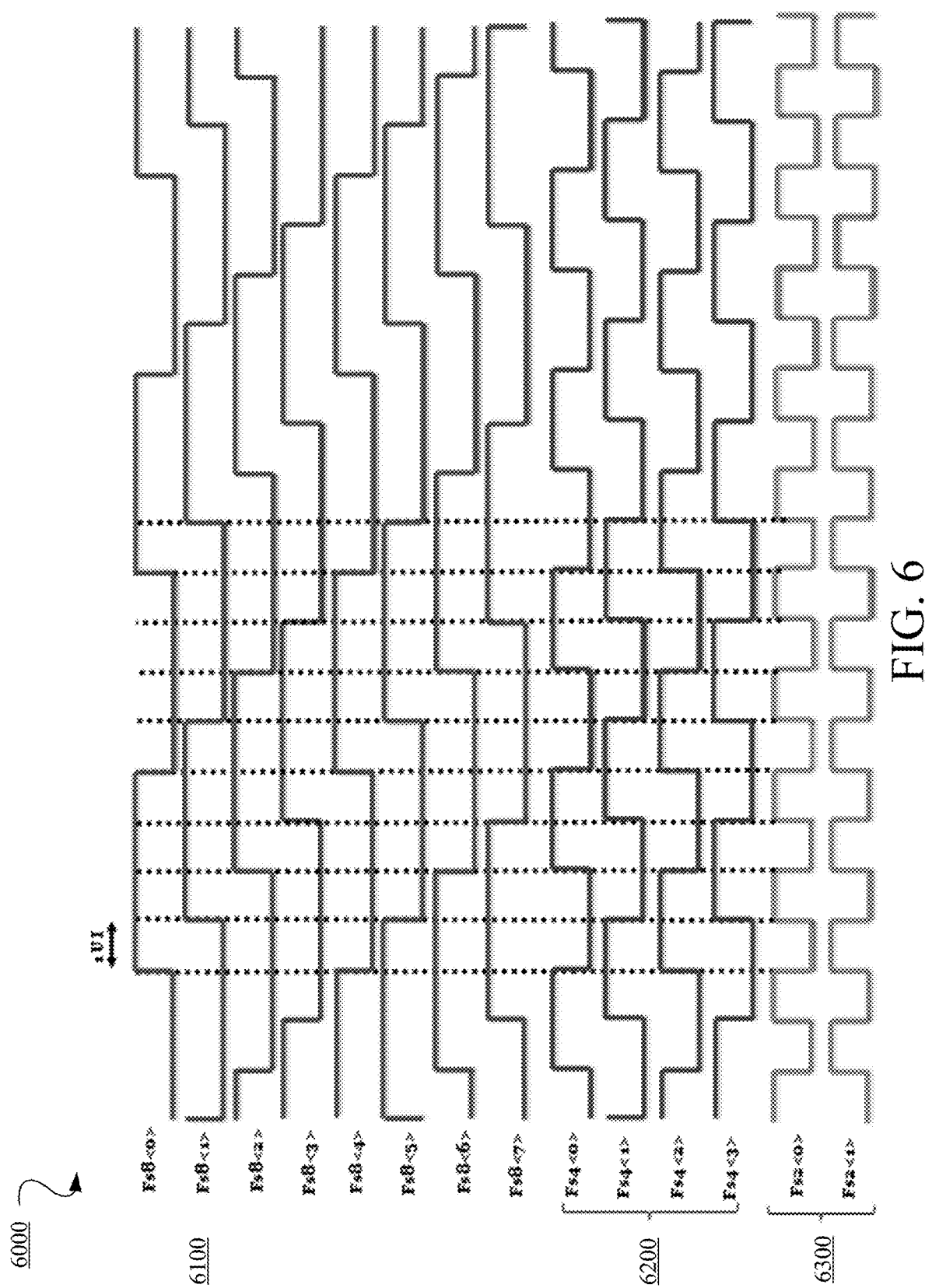
FIG. 6 is a diagram of multi-phase clock generation in accordance with embodiments of this disclosure.

FIG. 6 is a diagram 6000 of multi-phase clock generation in accordance with embodiments of this disclosure. Shown are frequency clock outputs 6100 of a $F_S/8$ multi-phase generator, frequency clock outputs 6200 of a frequency doubler, and frequency clock outputs 6300 frequency quadrupler. As described herein, the 8 phases of the $F_S/8$ clock are each 1 UI away from each other. The 8 phases can be fed into the frequency doubler and the frequency quadrupler. The four frequency clock outputs 6200 of the frequency doubler are each 1 UI away from one another.

Figure 7:
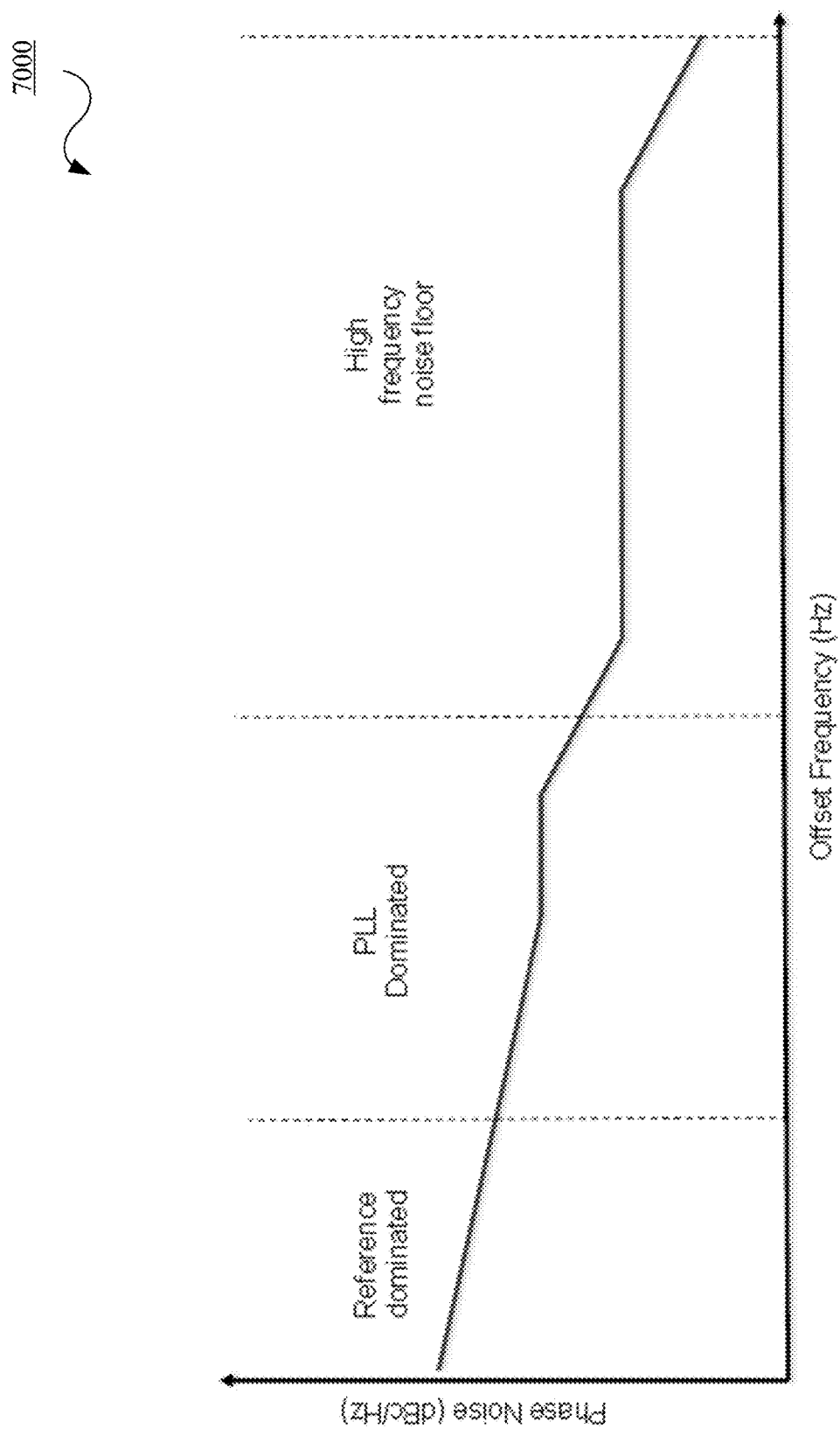
FIG. 7 is a diagram of phase noise of a high frequency clock driving a high frequency data converter.

FIG. 7 is a diagram of phase noise plot of a high frequency clock driving a high frequency data converter such as a multiplexor of FIG. 1. The low frequency jitter is mostly dominated by the $F_S/8$ generated in the PLL while the high frequency jitter is dominated by the clock generation in the DAC and distribution network. Jitter contribution in both bands are important for the performance of the DAC and the clock generation scheme described herein produces low jitter clocks at the output.

Figure 8:
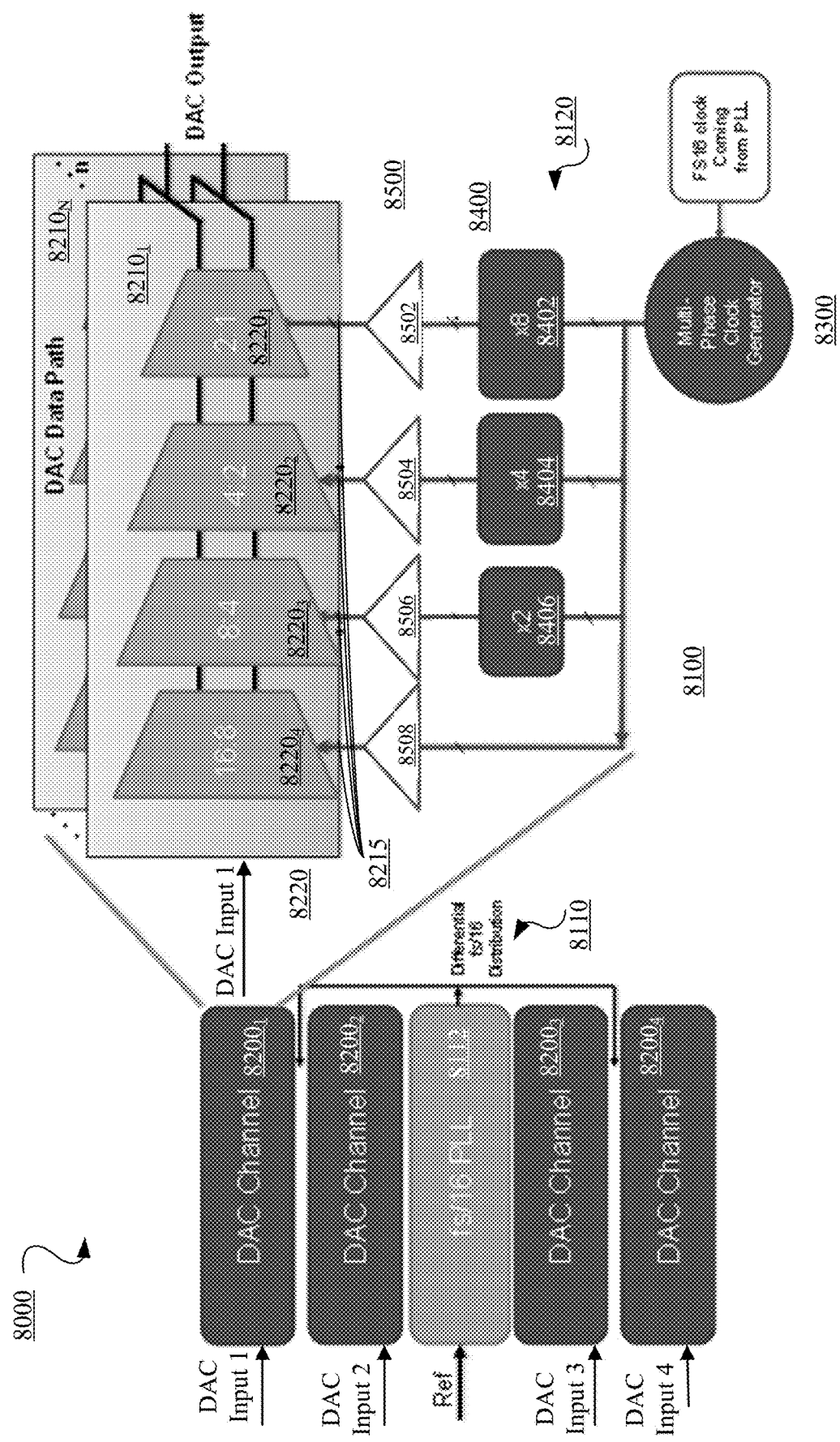
FIG. 8 is a block diagram of an example of a multi-channel DAC high speed device which includes a low power clock generation circuit in accordance with embodiments of this disclosure.

FIG. 8 is a block diagram of an example of a multi-channel DAC high speed device 8000 which includes a low power clock generation circuit 8000 in accordance with embodiments of this disclosure. The low power clock generation circuit 8100 includes a low frequency generation and distribution circuit 8110 and a channel local generation circuit 8120. The low frequency generation and distribution circuit 8110 includes a PLL 8112 which operates at and generates a low frequency clock from a reference clock (Ref). In implementations, the low frequency clock is a $F_S/16$ frequency clock. In implementations, the low frequency clock can be at least a $F_S/16$ or lower frequency clock. In implementations, the low frequency clock can be at least a differential $F_S/16$ or lower frequency clock. In implementations, the reference clock is a high precision external reference clock. In implementations, the reference clock can be a high frequency signal.

The multi-channel DAC high speed device 8000 includes multiple DAC channels $8200_1$, $8200_2$, $8200_3$, and $8200_4$. In implementations, the number of multiple DAC channels is M. The low frequency generation and distribution circuit 8110 generates and distributes the low frequency clock for use in the multiple DAC channels $8200_1$, $8200_2$, $8200_3$, and $8200_4$ via the channel local generation circuit 8120.

Each of the multiple DAC channels $8200_1$, $8200_2$, $8200_3$, and $8200_4$, such as DAC channels $8200_1$, for example, is a N bit DAC with N data paths $8210_1$, ..., $8210_N$. Each of the data paths $8210_1$, ..., $8210_N$, such as data path $8210_1$, includes input ports 8215 associated with different operating frequency clocks. Each of the data paths $8210_1$, ..., $8210_N$, such as data path $8210_1$, includes multiplexors 8220 such as, but not limited to, a 2:1 multiplexor 8222 operating at a $F_S/2$ clock frequency or rate, a 4:2 multiplexor 8224 operating at a $F_S/4$ clock frequency or rate, a 8:4 multiplexor 8226 operating at a $F_S/8$ clock frequency or rate, and a 16:8 multiplexor 8228 operating at a $F_S/16$ clock frequency or rate. The number of input ports 8215 along with the number and type of multiplexors comprising multiplexors 8220 associated with the input ports 8215 is illustrative and can vary without departing from the scope of the specification and claims described herein.

Each of the multiple DAC channels $8200_1$, $8200_2$, $8200_3$, and $4200_4$, such as DAC channels $8200_1$, for example, further includes a multi-phase clock generator 8300, factoring circuits 8400, and buffers 8500. The channel local generation circuit 8120 comprises the multi-phase clock generator 8300, the factoring circuits 8400, and the buffers 8500. The multi-phase clock generator 8300 operates at the low frequency clock. The multi-phase clock generator 8300 can generate multiple clocks with different phases separated by 1 UI ($1/F_S$) with respect to each other. The number of phases depends on the timing margin needed by the multiplexors 8220 to process the data input to the multiple DAC channels $8200_1$, $8200_2$, $8200_3$, and $8200_4$. In implementations, the multi-phase clock generator 8300 can be a delay locked loop, an injection locked oscillator, or like circuits and/or devices.

The multi-phase clock generator 8300 is connected to the 2:1 multiplexor 8222 via a double-quadrupler 8402 and a buffer 8502. The multi-phase clock generator 8300 is connected to the 4:2 multiplexor 8224 via a quadrupler 8404 and a buffer 8504. The multi-phase clock generator 8300 is connected to the 8:4 multiplexor 8226 via a doubler 8406 and a buffer 8506. The multi-phase clock generator 8300 is connected to the 16:8 multiplexor 8228 via a buffer 8508. As described herein, at least some of the input ports 8215 have multipliers such as the double-quadrupler 8402, the quadrupler 8404, and the doubler 8406.

In the illustrative implementation of FIG. 8, the multi-phase clock generator 4300 provides 16 clocks with 1 UI phase separation, which is then processed through the appropriate factoring circuits 8400 and buffers 8500, as applicable, to generate 2 phases at the $F_S/2$ frequency clock for the 2:1 multiplexor 8222, to generate 4 phases at the $F_S/4$ frequency clock for the 4:2 multiplexor 8224, to generate 8 phases at the $F_S/8$ frequency clock for the 8:4 multiplexor 8226, and to generate 16 phases at the $F_S/16$ frequency clock for the 16:8 multiplexor 8228, which in turn are used to process the appropriate DAC input to generate the DAC output.

Consequently, the channel local generation circuit 8120 is local or in each of the multiple DAC channels $8200_1$, $8200_2$, $8200_3$, and $8200_4$ and locally generates the appropriate higher frequency clocks. That is, the channel local generation circuit 4120 receives the low frequency clock from the low frequency generation and distribution circuit 4110 and multiplies the clocks up (instead of dividing down) as and when appropriate. Therefore, the state of the higher frequency clocks ($F_S/2$, $F_S/4$, and $F_S/8$) can be deterministically anticipated and allows for channel to channel synchronization without a reset signal.

Figure 9:
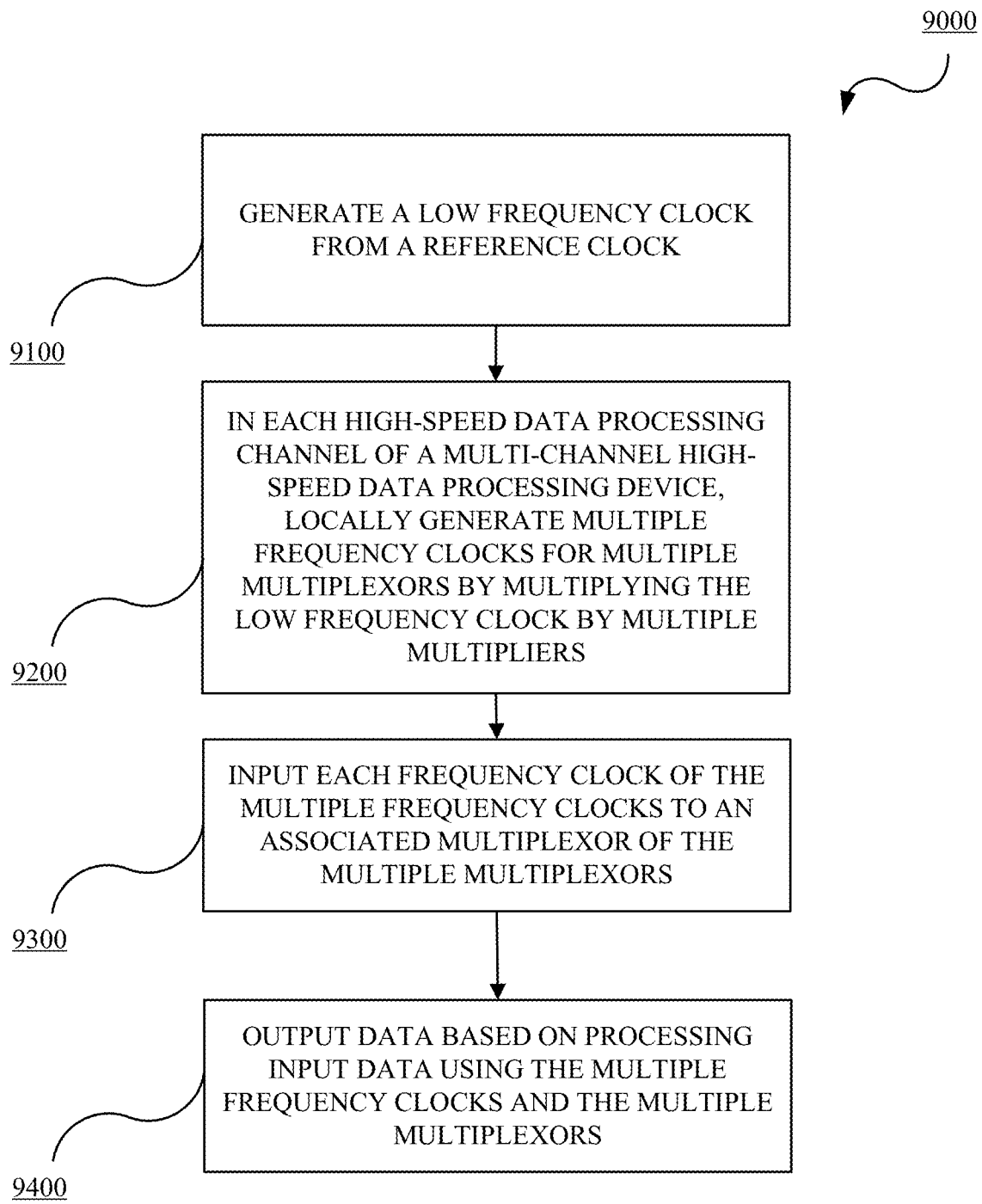
FIG. 9 is a flowchart of an example technique for low power clock generation for multi-channel high speed devices in accordance with embodiments of this disclosure.

FIG. 9 is a flowchart of an example method 9000 for low power clock generation for multi-channel high speed devices in accordance with embodiments of this disclosure. The method 9000 includes: generating 9100 a low frequency clock from a reference clock; in each high-speed data processing channel of a multi-channel high-speed data processing device, locally generating 9200 multiple clocks for multiple multiplexors by multiplying the low frequency clock by multiple multipliers; inputting 9300 a clock of the multiple clocks to an associated multiplexor of the multiple multiplexors; and outputting 9400 data based on processing input data using the multiple clocks and the multiple multiplexors. The method 9000 can be implemented by the multi-channel DAC high speed device 4000, the low power clock generation circuit 4100, the multiple DAC channels $4200_1$, $4200_2$, $4200_3$, and $4200_4$, the multi-channel transmitter serializer 5000, the low power clock generation circuit 5100, the multiple serializer channels $5200_1$, $5200_2$, $5200_3$, and $5200_4$, the multi-channel DAC high speed device 8000, the low power clock generation circuit 8100, and the multiple DAC channels $8200_1$, $8200_2$, $8200_3$, and $8200_4$, as appropriate and applicable.

The method 9000 includes generating 9100 a low frequency clock from a reference clock. A PLL is used to generate the low frequency clock from the reference clock. The low frequency clock can be a $F_S/8$, $F_S/16$, or lower frequency clock. The low frequency clock is distributed to each data processing channel of a multi-channel high-speed data processing device. In implementations, the low frequency clock can be divided down by a divider prior to reaching an associated input at the data processing channel.

The method 9000 includes in each high-speed data processing channel of a multi-channel high-speed data processing device, locally generating 9200 multiple frequency clocks for multiple multiplexors by multiplying the low frequency clock by multiple multipliers. Each of the high-speed data processing channels can include multiple multiplexors which operate at a multiple of the low frequency clock. Each of the high-speed data processing channels can include one or more multipliers, where a multiplier is associated with a multiplexor to multiply the low frequency clock to generate the appropriate multiplexor operating frequency clock. Each of the high-speed data processing channels can include a multi-phase clock generator which operates at the low frequency clock to generate multiple clocks with different phases separated by 1 UI ($1/F_S$) with respect to each other. The number of phases generated depends on the timing margin needed by the multiplexors to process the data input to the high-speed data processing channel. In implementations, each of the high-speed data processing channels can include a divider associated with a multiplexor to divide the low frequency clock to generate the appropriate multiplexor operating frequency clock. In implementations, the multi-channel high-speed data processing device can be a multi-channel DAC device, a multi-channel transmitter serializer, and the like.

The method 9000 includes inputting 9300 each frequency clock of the multiple frequency clocks to an associated multiplexor of the multiple multiplexors and outputting 9400 data based on processing input data using the multiple clocks and the multiple multiplexors. The frequency clock input to the associated multiplexor selectively controls operation of the multiplexor on the input data to generate the output data.

Figure 10:
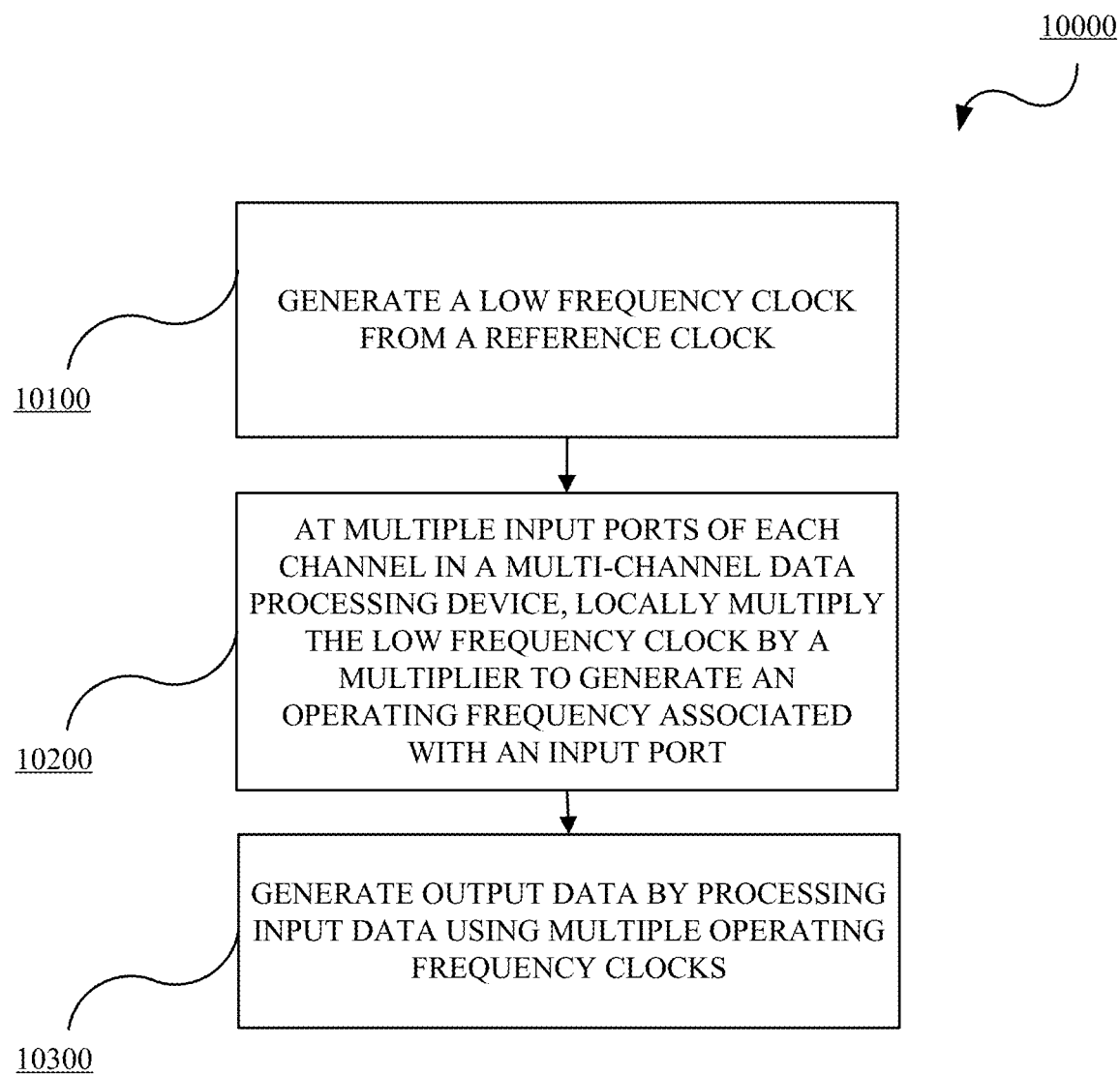
FIG. 10 is a flowchart of an example technique for low power clock generation for multi-channel high speed devices in accordance with embodiments of this disclosure.

FIG. 10 is a flowchart of an example method 10000 for low power clock generation for multi-channel high speed devices in accordance with embodiments of this disclosure. The method 10000 includes: generating 10100 a low frequency clock from a reference clock; at multiple input ports of each data processing channel of a multi-channel data processing device, locally multiply 10200 the low frequency clock by a multiplier to generate an operating frequency clock associated with an input port; and generating 10300 output data by processing input data using multiple operating frequency clocks. The method 10000 can be implemented by the multi-channel DAC high speed device 4000, the low power clock generation circuit 4100, the multiple DAC channels $4200_1$, $4200_2$, $4200_3$, and $4200_4$, the multi-channel transmitter serializer 5000, the low power clock generation circuit 5100, the multiple serializer channels $5200_1$, $5200_2$, $5200_3$, and $5200_4$, the multi-channel DAC high speed device 8000, the low power clock generation circuit 8100, and the multiple DAC channels $8200_1$, $8200_2$, $8200_3$, and $8200_4$, as appropriate and applicable.

The method 10000 includes generating 10100 a low frequency clock from a reference clock. A PLL is used to generate the low frequency clock from the reference clock. The low frequency clock can be a $F_S/8$, $F_S/16$, or lower frequency clock. The low frequency clock is distributed to each data processing channel of a multi-channel high-speed data processing device.

The method 10000 includes at multiple input ports of each data processing channel of a multi-channel data processing device, locally multiply 10200 the low frequency clock by a multiplier to generate an operating frequency clock associated with an input port. Each data processing channel receives the low frequency clock at multiple input ports, each input port associated with circuitry operating at a defined or given operating frequency clock. For some input ports, a multiplier at the input port multiplies the low frequency clock to generate the given operating frequency clock. In implementations, the low frequency clock can be divided down by a divider prior to reaching an associated input port at the data processing channel.

The method 10000 includes generating 10300 output data by processing input data using multiple operating frequency clocks. The operating frequency clock generated at each input port is used for processing the input data to generate the output data.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A multi-channel data processing device comprising:
   a low frequency clock generation and distribution circuit configured to generate and distribute a 1/N sampling frequency ($F_S$)($F_S$/N) clock, wherein N is larger or equal to 8; and
   multiple data processing channels connected to the low frequency generation and distribution circuit, each data processing channel comprising
      input ports associated with different operating frequency clocks; and
      a channel local clock generation circuit comprising multipliers associated with some of the input ports, each multiplier configured to multiply the $F_S$/N frequency clock to locally generate an operating frequency clock associated with an input port of the input ports.

2. The device of claim 1, wherein the channel local clock generation circuit further comprises a multi-phase clock generator configured to generate multiple $F_S$/N frequency clocks with different phases for each input port.

3. The device of claim 2, wherein the different phases are 1/$F_S$ apart.

4. The device of claim 1, wherein a number of the multiple $F_S$/N frequency clocks is dependent on a timing margin needed by a data processing channel to process input data.

5. The device of claim 1, wherein each data processing channel further comprises
   a multiplexor associated with each input port; and
   a multi-phase clock generator connected to each multiplexor, the multi-phase clock generator configured to generate a number of $F_S$/N frequency clocks with different phases, wherein the number is dependent on a timing margin requirement of a multiplexor to process input data.

6. The device of claim 1, wherein the low frequency clock generation and distribution circuit further comprises an $F_S$/N divider to generate an operating frequency clock associated with another input port of the input ports.

7. The device of claim 1, wherein the channel local clock generation circuit further comprises an $F_S$/N divider to generate an operating frequency clock associated with another input port of the input ports.

8. The device of claim 1, wherein the low frequency clock generation and distribution circuit further comprises a phase locked loop operating at the $F_S$/N frequency clock, the phase locked loop configured to generate the $F_S$/N frequency clock from a reference clock.

9. The device of claim 1, wherein the multi-channel data processing device is a multi-channel digital-to-analog converter (DAC) and each data processing channel is a M bit DAC channel with M data paths, each data path includes a set of the input ports and a multiplexor associated with each input port in the set of input ports, the channel local clock generation circuit configured to provide the different operating frequency clocks to each of the M data paths.

10. The device of claim 1, wherein the channel local clock generation circuit further comprises a multi-phase clock generator configured to generate a number of $F_S$/N frequency clocks with different phases, wherein the number is dependent on a timing margin requirement of a multiplexor to process input data.

11. A method for low power clock generation, the method comprising:
   generating, by a phase locked loop of a multi-channel high-speed data processing device, a 1/N sampling frequency ($F_S$)($F_S$/N) frequency clock from a reference clock, wherein N is larger or equal to 8;
   locally generating, in each high-speed data processing channel of the multi-channel high-speed data processing device, multiple operating frequency clocks for multiple multiplexors by multiplying the $F_S$/N frequency clock by multiple multipliers, the multiple multiplexors and the multiple multipliers in the high-speed data processing channel;
   controlling a multiplexor of the multiple multiplexors with an associated operating frequency clock of the multiple operating frequency clocks; and
   outputting data based on processing input data using the multiple operating frequency clocks and the multiple multiplexors.

12. The method of claim 11, the method further comprises generating, by a multi-phase clock generator in the high-speed data processing channel, multiple $F_S$/N frequency clocks with different phases for controlling each of the multiple multiplexors.

13. The method of claim 12, wherein the different phases are 1/$F_S$ apart.

14. The method of claim 11, wherein a number of the multiple $F_S$/N frequency clocks is dependent on a timing margin needed by the multiple multiplexors to process the input data.

15. The method of claim 11, the method further comprises dividing, by $F_S$/N divider in the multi-channel high-speed data processing device, the $F_S$/N frequency clock to generate an operating frequency clock associated with another multiplexor of the multiple multiplexors.

16. The method of claim 11, the method further comprises locally dividing, by $F_S$/N divider in the high-speed data processing channel, the $F_S$/N frequency clock to generate an operating frequency clock associated with another multiplexor of the multiple multiplexors.

17. A method for low power clock generation, the method comprising:
   distributing, by a low frequency clock generation and distribution circuit of a multi-channel data processing device, a 1/N sampling frequency ($F_S$)($F_S$/N) frequency clock based on a reference clock, wherein N is larger or equal to 8;
   locally multiplying, at multiple input ports of each data processing channel of the multi-channel data processing device, the $F_S$/N frequency clock by a multiplier to generate an operating frequency clock associated with each input port of the multiple input ports; and
   generating output data by processing input data using multiple operating frequency clocks.

18. The method of claim 17, the method further comprising generating, by a multi-phase clock generator in the data processing channel, a number of $F_S$/N frequency clocks with different phases.

19. The method of claim 18, wherein the different phases are 1/$F_S$ apart and the number of the $F_S$/N frequency clocks is dependent on a timing margin needed by a data processing channel to process the input data.

20. The method of claim 17, the method further comprising dividing, by $F_S/N$ divider, the $F_S/N$ frequency clock to generate an operating frequency clock associated with another input port of the multiple input ports.

\* \* \* \* \*